United States Patent [19]
Embree

[11] Patent Number: 5,389,892
[45] Date of Patent: Feb. 14, 1995

[54] INPUT STAGES FOR HIGH VOLTAGE OPERATIONAL AMPLIFIER

[75] Inventor: Milton L. Embree, Muhlenberg Township, Berks County, Pa.

[73] Assignee: AT&T Corp., Murray Hill, N.J.

[21] Appl. No.: 150,628

[22] Filed: Nov. 9, 1993

[51] Int. Cl.⁶ .............................................. H03F 3/45
[52] U.S. Cl. ................................... 330/253; 330/257; 330/311
[58] Field of Search ................. 330/253, 257, 300, 311

[56] References Cited
U.S. PATENT DOCUMENTS

| 4,185,211 | 1/1980 | Kucharewski | 330/257 X |
| 4,897,611 | 1/1990 | Laber et al. | 330/253 |

FOREIGN PATENT DOCUMENTS

| 181806 | 10/1984 | Japan | 330/257 |
| 302609 | 12/1988 | Japan | 330/257 |

*Primary Examiner*—James B. Mullins

[57] ABSTRACT

A high voltage operational amplifier includes a first differential stage whose output is supplied to a current mirror amplifier (CMA) comprised of bipolar transistors, for driving a high voltage MOS output transistor. The bipolar CMA is selected and configured to provide low equivalent input noise and low input voltage offset.

16 Claims, 4 Drawing Sheets

INPUT STAGES FOR HIGH VOLTAGE OPERATIONAL AMPLIFIER

BACKGROUND OF THE INVENTION

This invention relates to high voltage operational amplifiers, and, in particular, to a high voltage operational amplifier (OP-AMP) employing bipolar and high voltage insulated-gate field-effect transistors (IGFETs).

A problem exists when it is desired to design and manufacture a high voltage, low noise, high frequency operational amplifier (OP-AMP) with low input voltage offset. This is best explained with reference to FIG. 1 which shows a first, differential input, stage comprised of P-type IGFET transistors T1 and T2 having their sources connected in common to a common node 11 and via a current source 17 to a point of operating potential 19. The drains of transistor T1 and T2 are respectively coupled to the input 81 and output 82 of a current mirror amplifier (CMA) 83 comprised of N-channel double diffused metal oxide semiconductor (DMOS) transistors (T4, T5). The output of the first stage, which corresponds to the output of the CMA 83, is applied to the gate of an N-channel DMOS transistor (T3) which functions as the second stage of the operational amplifier. The use of the N-channel DMOS transistors for the CMA transistors is suggested by their high voltage capability and a manufacturing process similar to that used to form the output transistor T3 and the input differential transistors, T1,T2. However, the noise performance of the combination is very poor. Test results indicate that the equivalent input noise is in the range of a few thousand nanovolts per root Hertz. Such a high value for the equivalent input noise is unacceptable for a "low noise", high quality OP-AMP and negates the use of the DMOS transistors in the first stage of a high-quality OP-AMP.

The noise problem resulting from using high voltage DMOS transistors in the front end of an OP-AMP may be resolved by using a circuit of the type shown in FIG. 2 in which the N-channel DMOS transistors are replaced with NPN bipolar transistors. In FIG. 2, the current mirror 84 includes bipolar transistors Q1, Q2 and the second stage (QOUT) also consists of a bipolar transistor. The combination has a very acceptable noise performance. However, the output bipolar transistor QOUT has limited high voltage capability which limits the operating and output voltage of the circuit.

It is an object of the invention to overcome the limitation on high noise and/or high voltage operation present in the prior art circuits and to form an OP-AMP capable of operating at high voltages with low noise and also with low input voltage offset.

SUMMARY OF THE INVENTION

Accordingly, in an operational amplifier according to the invention, the second stage includes a high voltage field-effect transistor (FET) which is driven and controlled by a bipolar transistor current mirror amplifier (CMA) with the CMA being, in turn, coupled to a differential input stage comprised of high voltage field-effect transistors. The FET of the second stage provides high voltage drive capability and the bipolar CMA driving the second stage enables operation with a low equivalent input noise and a low input voltage offset.

In a particular embodiment, the FET of the second stage is an N-channel, double-diffused metal oxide-semiconductor (DMOS) transistor, and the CMA is comprised of NPN bipolar transistors.

According to one aspect of the invention, the CMA includes means for substantially reducing, if not eliminating, the effect of base currents in the CMA and for rendering the output impedance of the CMA very high to provide low input voltage offset, low noise and suitable drive for the control electrode of the high voltage FET of the second stage.

BRIEF DESCRIPTION OF THE DRAWING

In the accompanying drawing, like reference characters denote like components.

DETAILED DESCRIPTION OF THE INVENTION

Figure 2:
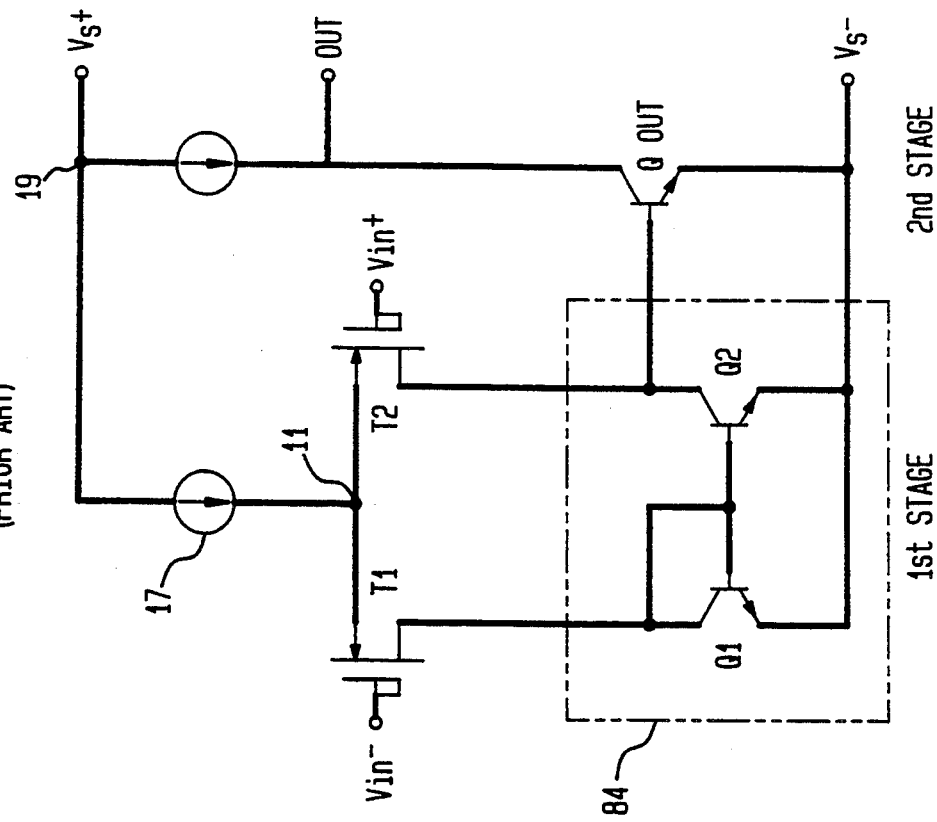
FIG. 2 is a schematic diagram of the first and second stages of a high voltage OP-AMP in accordance with the prior art.
Figure 1:
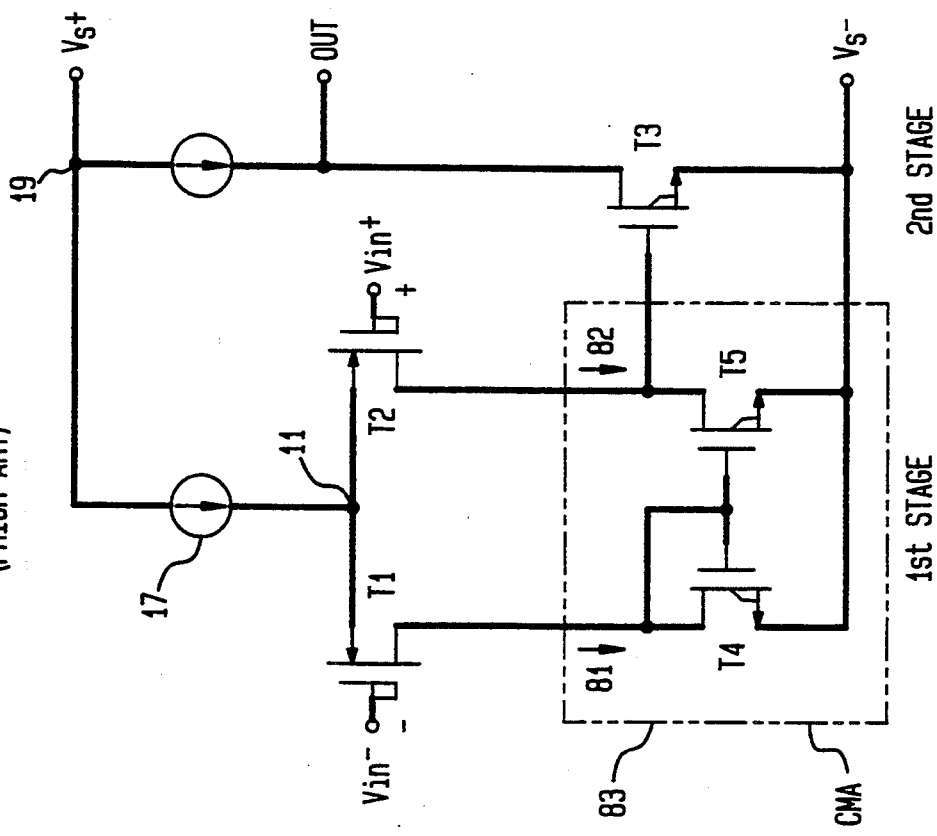
FIG. 1 is a schematic diagram of the first and second stages of a high voltage operational amplifier (OP-AMP) employing high voltage insulated-gate field-effect transistors (IGFETs) in accordance with the prior art.
Figure 3:
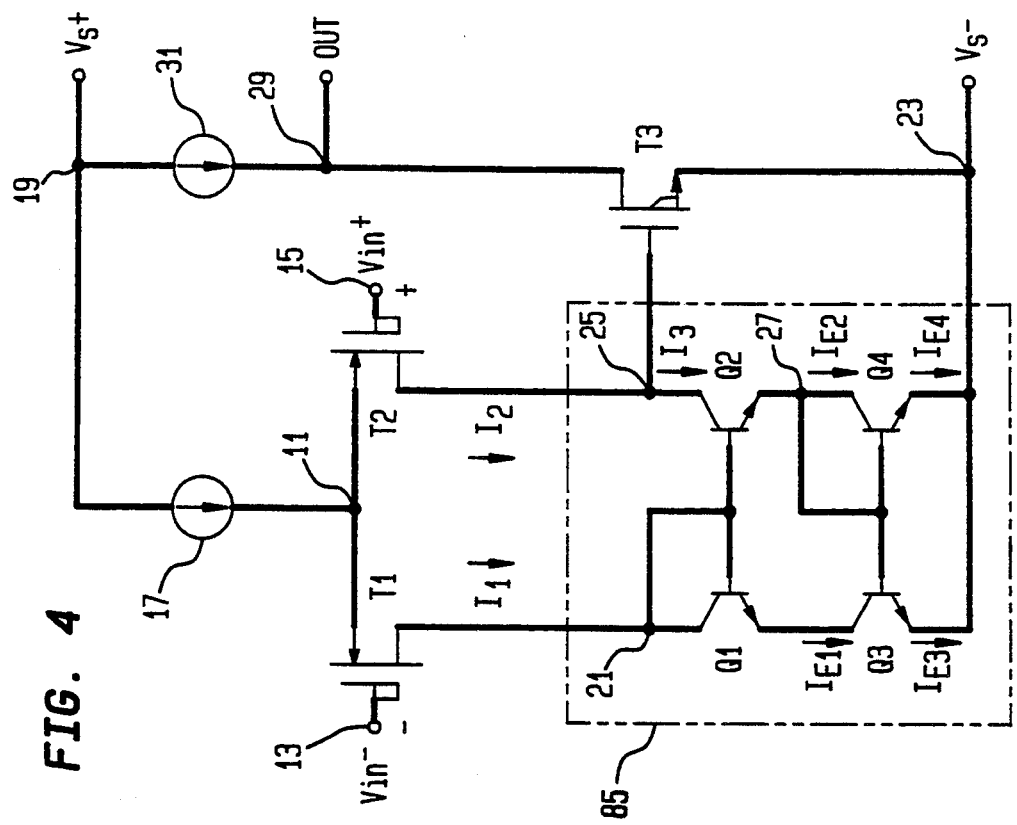
FIG. 3 is a schematic diagram of the first and second stages of a high voltage OP-AMP in accordance with the invention.

Referring to FIG. 3, there is shown a first insulated-gate field-effect transistor (IGFET) T1, and a second IGFET, T2, having their source electrodes connected in common to a node 11. The gate of T1 is connected to an input terminal 13 to which is applied an input voltage $V_{IN}(-)$ and the gate of T2 is connected to an input terminal 15 to which is applied an input voltage $V_{IN}(+)$. T1 and T2 are high voltage devices but need not be high power devices since they are designed to handle relatively low currents.

A relatively constant current source 17 is connected between node 11 and a positive rail or operating power terminal 19 to which is applied a fixed operating potential of $+Vs$ volts.

The drain of T1 is connected to a node 21 which defines the input of a CMA 84 and to which is connected the collector and base of an NPN bipolar transistor Q1 and the base of an NPN bipolar transistor Q2. The drain of T2 is connected to a node 25 which defines the output of CMA 84 and to which is connected the collector of Q2. Note that nodes 21 and 25 also define the output nodes of the first differential input stage of an OP-AMP. The emitters of Q1 and Q2 are connected to a negative rail, or power terminal, 23 to which is applied a fixed operating potential of $-Vs$ volts.

In circuits embodying the invention the operating potential [$(+)Vs$ and $(-)Vs$] applied between terminals 19 and 23 may range from several volts (e.g., 5 volts) to several hundred volts.

In the circuit of FIG. 3, the gate of a DMOS N-channel transistor, T3, is connected to terminal 25, its source is connected to terminal 23 and its drain is connected to an output terminal 29, which defines the output of the second stage of the operational amplifier. A current source 31 is connected between operating power terminal 19 and output terminal 29.

Transistor T3 is a high voltage drive transistor and its threshold voltage is, typically, in the two to four volt range.

In response to a differential signal applied between terminals 13 and 15, current is caused to flow through the source drain path of T1. Depending on the amplitude and polarity of the signal, the current I1 into node 21 increases or decreases. The current I1 flows into Q1 and the base of Q2 and is mirrored via Q2 which draws a proportional current IC2 out of node 25. For Q1 and Q2 being made to have the same geometries, IC2 is nearly equal to I1. The current I2 produced by T2 flows into node 25. The difference between I2 into node 25 and IC2 out of node 25 determines the direction and rate of change of the voltage at node 25. When the voltage at node 25 (V25) is above the threshold voltage (Vt) of T3, T3 is turned-on and conducts. When V25 is less than the Vt of T3, T3 is turned-off and is non-conducting.

In operation, the circuit of FIG. 3 provides suitable amplification with low noise. However, there are some significant problems with the circuit of FIG. 3. One problem with the circuit of FIG. 3 is that an offset error is produced due to base current flow in the current mirror configuration. That is, for the condition when $V_{IN}(-)$ is equal to $V_{IN}(+)$, the current IC2 is not exactly equal to I2 and for the closed loop condition a signal or offset voltage is produced at the output. The input offset voltage as used herein is defined as the differential input that must be applied between terminals 15 and 13 to cause the output signal voltage to be zero (typically, for zero differential input signal, the output voltage should equal one half the supply voltage). Another problem is due to the difference in the collector voltage produced across Q1 and Q2. In FIG. 3, the collector-to-emitter voltage ($V_{CE}$) of Q1 would be approximately equal to the forward voltage ($V_F$) drop of a diode (which is typically in the range of 0.7 volts) throughout the range of operation. However, when operated in the closed loop configuration, the $V_{CE}$ across Q2 may vary from Vth of T3 (approximately 3.0 volts) to a much higher value of voltage depending on the condition of T3 and the OP-AMP second stage current source. When the collector voltage of Q2 is very different from that of Q1, the gain of the two transistors varies significantly. As a result, there will be produced an effective offset at the input due to the gain variation. In effect, this offset results from the CMA having a relatively low output impedance for these operating conditions.

Figure 4:
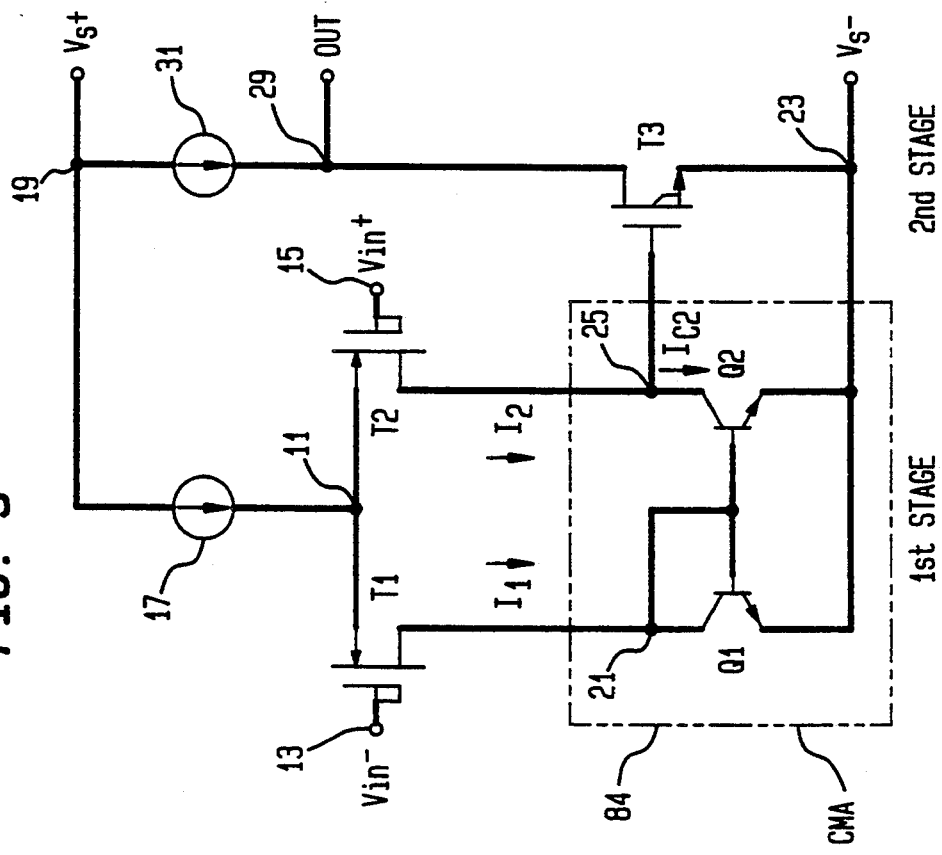
FIG. 4 is a schematic diagram of the first and second stages of an OP-AMP embodying the invention for providing low input offset voltage.

These problems are significantly reduced in the circuit of FIG. 4. The circuit of FIG. 4, like that of FIG. 3, includes a first IGFET, T1, and a second IGFET, T2, having their source electrodes connected in common to node 11, with the gates of T1 and T2 being respectively connected to input terminals 13 and 15 to which are, respectively, applied $V_{IN}(-)$ and $V_{IN}(+)$. The drains of T1 and T2 are, respectively, connected to nodes 21 and 25 which define first and second output nodes of the first differential input stage.

A relatively constant current source 17 is connected between node 11 and power terminal 19, and a load current source 31 is connected between terminal 19 and terminal 29 which defines the output of the second stage of the operational amplifier. As in FIG. 3, transistor T3 is a DMOS high voltage driving device having its gate connected to terminal 25, its source connected to terminal 23, and its drain connected to terminal 29, to which is connected current source 31.

The significant difference between the circuit of FIG. 3 and that of FIG. 4 is the modification of the current mirror amplifier. The CMA 85 in FIG. 4 includes the collector and base of an NPN bipolar transistor Q1 and the base of an NPN bipolar transistor Q2 connected to node 21, as in FIG. 3. However, in FIG. 4, the emitter of Q1 is connected to the collector of an NPN bipolar transistor Q3 whose emitter is connected to power terminal 23. The emitter of Q2 is connected to a node 27 to which is connected the base and collector of an NPN bipolar transistor Q4 and the base of Q3. The emitter of Q4 is returned to terminal 23.

The combination of Q1, Q2, Q3 and Q4 functions as a current mirror amplifier (CMA) in which the effects of base currents are significantly and substantially reduced. Assuming the bipolar transistors to be matched, it can be readily demonstrated that for a current I1 into node 21, the current I3 sunk by Q2 is substantially equal to I1. Hence, for a balanced condition, when $V_{IN}(-)$ is equal to $V_{IN}(+)$, the current I3 drawn (sunk) out of node 25 is essentially equal to the current I2 flowing into node 25. Circuit analysis indicates that IE1 is equal to I1−Ib2, and IE2 is equal to I3+Ib2. The current IE4 is equal to I3+Ib2−Ib3 and IE3 is equal to I1−Ib2+Ib3. Where the bipolar transistors are well matched, the current through Q4 is substantially equal to the current through Q3 when their collector voltages are substantially equal.

In the CMA of FIG. 4, transistor Q4 provides negative feedback to increase the output impedance of the CMA. Furthermore, first order cancellation of the base currents is achieved with this configuration, rendering the ratio of the output current (I3) to the input current (I1) less sensitive to the forward current gain of the transistors. The difference between I1 and ICQ3 (or IE1) flows into the base of Q2. This base current is multiplied by the forward current gain (Beta) plus 1 of Q2 and flows into diode connected Q4. Q4 causes a like current to flow in Q3. The current in Q3 draws current out of Q1 defining a feedback path which regulates I3 so that I3 is driven to be more substantially equal to I1.

It was noted that in FIG. 3, Q1 and Q2 operate at substantially different collector-to-emitter voltages over the operating range. It can be readily demonstrated that, in FIG. 4, transistors Q3 and Q4 are operated at essentially the same collector-to-emitter voltages over the full range of operation. Note that the collector and base of diode connected transistor Q4 are at the same voltage; i.e. $V_{BEQ4}=V_{CEQ4}$. The base-to-emitter of Q3 is at the same voltage as that of Q4 (i.e., $V_{BEQ3}=V_{BEQ4}=V_{CEQ4}$). The voltage at the base of Q2 will be at one $V_{BE}$ drop above the collector voltage of Q4. The collector voltage of Q3 which is equal to the emitter voltage of Q1 will be one $V_{BE}$ drop below the voltage at the base of Q2. Hence, the collector and base voltages of Q3 will be substantially equal to the collector and base voltages of Q4 throughout the range of operation. Thus, the response of Q3 and Q4 will be substantially identical over the range of operation, ensuring equality of Q3 and Q4 emitter currents. Feedback ensures a high output impedance at node 25. This high output impedance makes the current mirror (85) operation relatively independent of the voltage variations at output node 25 and bipolar transistor matching makes its operation relatively independent of the base current in the bipolar transistors.

It has therefore been shown that in CMA 85 the effects of base currents are substantially and significantly reduced. Furthermore, the use of the upper (Q1, Q2) set of mirroring transistors equalizes the NPN collector voltages for the lower pair of NPN transistors (Q3,Q4).

In addition, the output impedance of the current mirror 85 in FIG. 4 is extremely high. This feature minimizes the offset caused by the differing collector voltages on the upper pair (Q1, Q2) of NPN transistors.

This latter feature is critical to proper operation of the OP-AMP because the threshold voltage of T3, which is selected to be a DMOS transistor, is in the range of 2 to 4 volts. This requires that the collector-to-emitter voltage of Q2 be in the range of 1 to 3 volts while the other bipolar transistors have collector-to-emitter voltages of approximately 0.6–0.7 volts.

The combination of the features discussed above ensures that the output transistor T3 will be driven in a manner to ensure low equivalent input noise and low input offset voltage.

Figure 5:
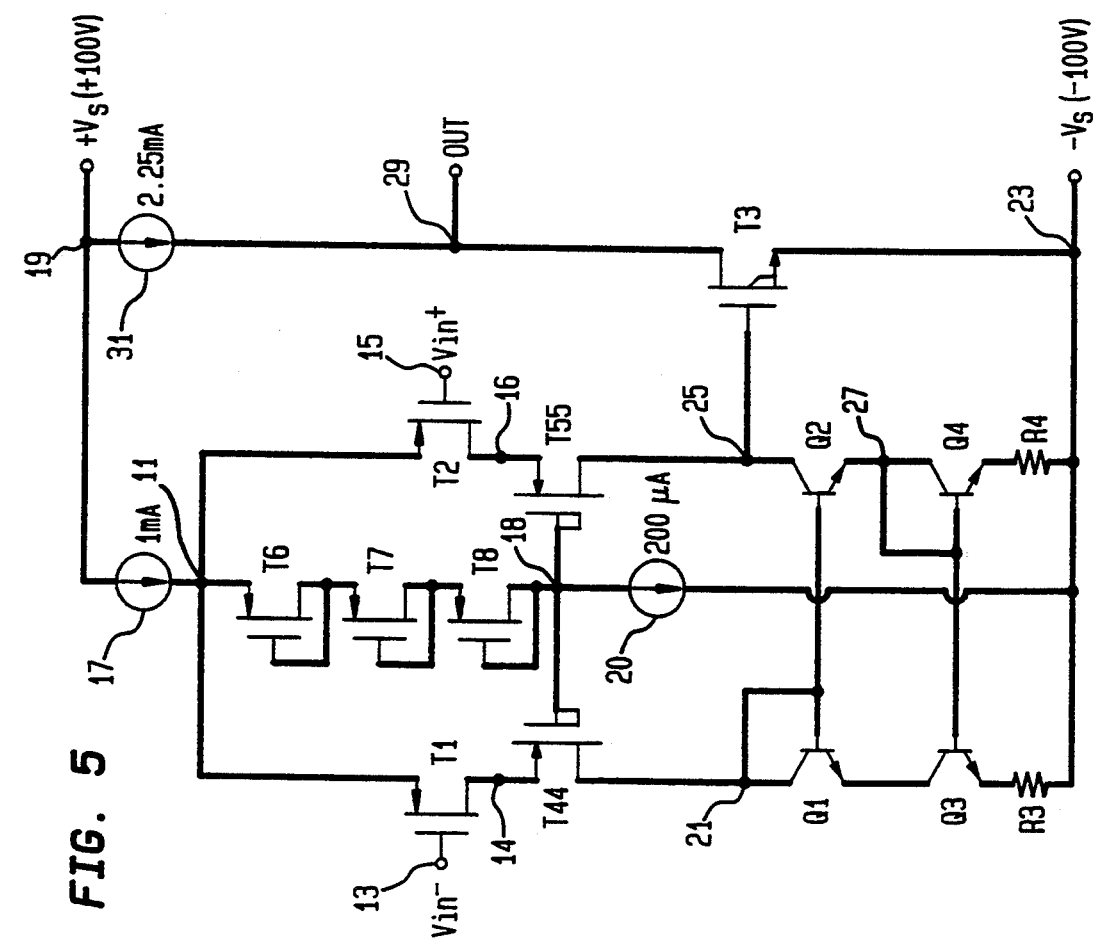
FIG. 5 is another schematic diagram of the first and second stages of an OP-AMP embodying the invention.

FIG. 5 illustrates modification to "the input circuit of FIG. 4 and biasing circuitry for the input stage. In FIG. 5, an IGFET T44 has its conduction path connected between node 14, at which is connected the drain of T1, and node 21 and an IGFET T55 has its conduction path connected between node 16, at which is connected the drain of T2, and node 25.

The gates of T44 and T55 are connected to a common bias point 18. Three IGFETs (T6, T7, T8) connected as diodes and in series between nodes 11 and 18 establish a bias level at node 18. A current source 20 connected between node 18 and terminal 23 insures that T44 and T55 are normally biased into conduction. In the circuit of FIG. 5, source 20 is shown to conduct 200 microamperes. In addition, the CMA includes degenerative resistors R3 and R4. The use of these resistors, which is optional, tends to decrease the equivalent input noise and the equivalent input offset voltage. In FIG. 5, T1 is connected in cascode with T44 and T2 is connected in cascode with T55. A significant aspect of this circuit configuration is that the insertion of transistors T44 and T55 enable T1 and T2 to be made relatively low voltage transistors. This is so because a substantial portion of the high supply voltage is made to appear across the conduction paths of T44 and T55 which are biased to conduct in the common gate mode. When T1 and T2 can be made relatively low voltage (e.g., 5 to 15 volts) devices, they can be replaced by relatively low voltage, high frequency MOS or bipolar transistors. For the configuration of FIG. 5, to replace T1 and T2 with the bipolar transistors, they would be PNP transistors.

In FIG. 5, note that Vs is +100 volts, −Vs is −100 volts, current source 17 supplies 1 milliampere of current and load source 31 supplies 2.25 milliamperes of current. The remainder of the circuit of FIG. 5 is similar, and equivalent, to that of FIG. 4 and its operation need not be further discussed.

Figure 6:
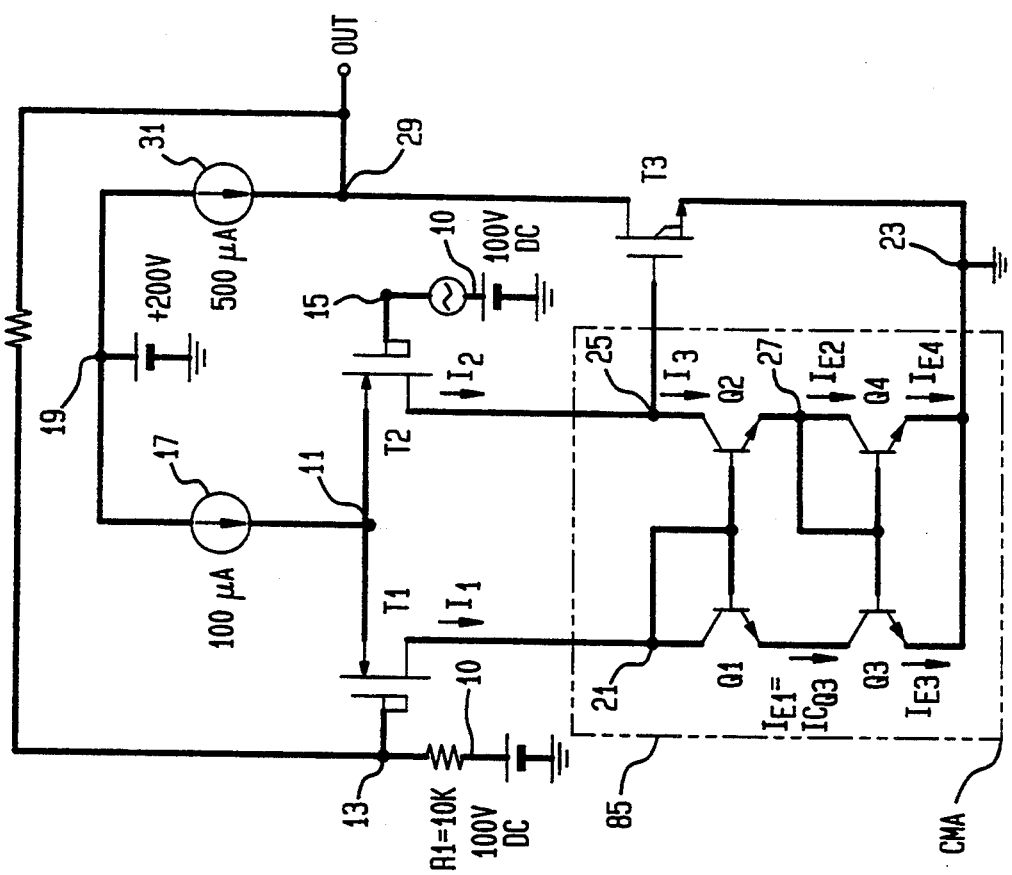
FIG. 6 is a schematic diagram of the circuit of FIG. 4 with feedback connections.

FIG. 6 illustrates the closed loop operation of the circuit of FIG. 4. In FIG. 6, a feedback resistor R2 is connected between output terminal 29 and signal input terminal 13 and an input resistor R1 is connected between terminal 13 and a bias point 10 to which is applied a DC voltage equal to ½ the supply voltage (i.e., 100 volts). The ratio of R2 to R1, selected herein for illustrative purposes, provides a voltage gain of 100 for the amplifier. For purpose of illustration, the current source 17 is shown to supply a current of 100 microamperes and the current source 31 connected between power terminal 19 and output node 29 supplies a current of 500 microamperes. A dc bias of 100 volts is also applied to terminal 15 and an AC signal is superimposed on the dc bias. In FIG. 6, a supply voltage (Vs) of +200 volts is applied to the positive line or rail 19 and ground is applied to the negative rail or line 23. A dc bias of Vs/2 (i.e., 100 volts) is then applied to the input terminals 13 and 15. Alternatively, a positive supply voltage +Vs (e.g., 100 volts) may be applied to rail 19, a negative supply voltage (e.g., −100 volts) may be applied to terminal 23 with the input terminals 13 and 15 being referenced to ground.

The operation of the OP-AMP of FIG. 6 with the feedback resistor R2 equal to 990K ohms and the resistor R1 equal to 10K ohms may be explained as follows. Assuming circuit operation to begin with node 25 and the gate of T3 close to zero volts, T3 is turned-off and the voltage at output node 29 is at, or moves towards, the positive voltage (200 volts) on line 19. When node 29 exceeds 100 volts by delta V, the voltage fedback to terminal 13 will exceed the bias voltage of 100 volts at node 13 by 1/100th of delta V. This causes the voltage at terminal 13 to be greater than that at terminal 15. Since T1 and T2 are P-type IGFETs, T1 will conduct less current than T2. The drain current of T1 flows into the input of the current mirror amplifier and produces an output current of the CMA, which is substantially equal to its input current. The current I3, flowing out of node 25, is then less than the current I2 from T2 flowing into node 25.

Thus, the collector current of Q2 is less than the drain current of T2 and the voltage at the gate of T3 increases, rising towards the positive supply rail. The rise in voltage at node 25 continues until the threshold voltage (Vt) of T3 is reached. The Vt of DMOS transistors is typically in the range of 2 to 4 volts; but depending on processing variation, could be higher or lower. When the Vt of T3 is reached (and somewhat exceeded) T3 is turned on and conducts current out of node 29. The turn-on of T3 increases and continues until the drain current of T3 is equal to the 500 microamperes supplied by load source 31 into node 29. For this current condition, the voltage at node 29 will be 100 volts (i.e., Vs/2) and the current in the feedback path (R2,R1) goes to zero. The static condition of the circuit is then established and any perturbation (e.g., noise) which tends to alter the static conditions will be quickly canceled by the negative feedback process, as is known in the art.

Figure 8:
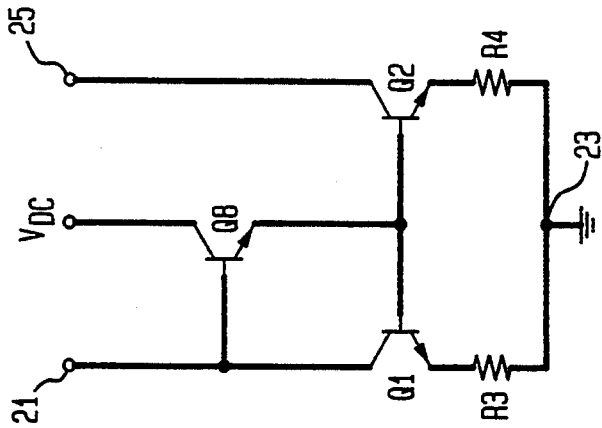
FIGS. 7 and 8 are schematic diagrams of current mirror amplifiers suitable for use in circuits embodying the invention.
Figure 7:
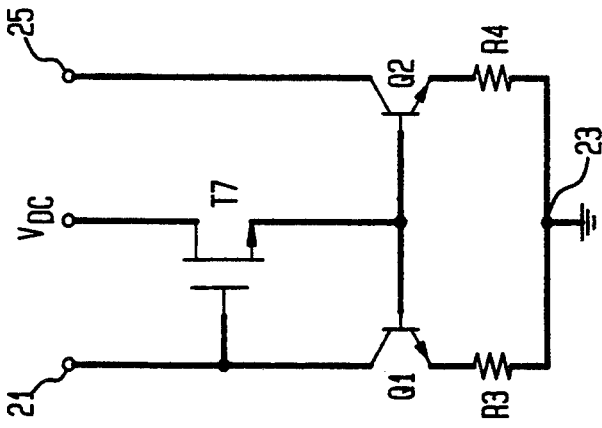

Current mirror amplifiers for use in circuits embodying the invention may also include the configurations shown in FIGS. 7 and 8. In the configurations of FIGS. 7 and 8, the basic current mirror configuration of Q1 and Q2 illustrated in FIG. 3 is enhanced by means of degenerative resistors (R3,R4) and an additional transistor (IGFET T7 in FIG. 7, and NPN bipolar transistor Q8 in FIG. 8) to supply base currents and provide higher output impedance at the CMA output node. In FIG. 7, an IGFET T7 is connected with its gate electrode to the drain of T1 (node 21) and also the collector of Q1 and its source electrode to the bases of Q1 and Q2 and a dc voltage which may typically range in value from 10 to 300 volts is applied to the drain of T7. In FIG. 8, an NPN bipolar transistor is connected with its base to the drain of T1 and the collector of Q1 at node 21, and its emitter to the bases of Q1 and Q2 and a suitable positive dc voltage is applied to its collector electrode.

The invention has been shown using input transistors of P-conductivity type, NPN bipolar transistors and an output DMOS transistor T3 of N-conductivity type. It should be appreciated that a circuit formed of transistors complementary to those shown is included in the ambit of the invention. It should also be understood that transistors of different conductivity type than those shown may be used to practice the invention. Transistor T3 has been identified as a DMOS device. But it should be evident that any suitable high voltage field-effect transistor (FET) could be used instead.

For ease of illustration, only two stages of amplification have been shown in FIGS. 3, 4 and 5. However, as is known in the art, it should be evident that additional stages of amplification can be cascaded with the inverter stage comprising T3 to provide greater power drive.

What is claimed is:

1. The combination comprising:
    first and second power terminals for the application therebetween of an operating potential;
    first and second signal input terminals;
    an input stage comprised of insulated-gate field-effect transistors (IGFETs); each IGFEI having source and drain electrodes defining the ends of a main conduction path and a control electrode whose applied potential determines the conductivity of the conduction path; said input stage including first and second IGFETs;
    a relatively constant current source;
    means connecting said relatively constant current source between said first power terminal and the source electrodes of said first and second IGFETs;
    means connecting the control electrode of said first IGFET to said first signal input terminal and the control electrode of said second IGFET to said second signal input terminal;
    first and second nodes;
    means connecting the drain of said first IGFET to said first node and the drain of said second IGFET to said second node;
    a current mirror amplifier (CMA) for use in combination with said input stage comprised of a first main current-carrying path and a second main current-carrying path for conducting a current which mirror the current in the first main current-carrying path, said first and second main current-carrying paths comprised solely of bipolar transistors for producing a signal having low noise and low voltage offset at said second node; said CMA including first and second bipolar transistors, each bipolar transistor having an emitter and a collector defining the ends of a main conduction path and a base;
    means connecting the bases of said first and second bipolar transistors and the collector of said first bipolar transistor to the drain of said first IGFET at said first node;
    means connecting the collector of said second bipolar transistor to said second node;
    means connecting the emitters of said first and second bipolar transistors to said second power terminal;
    an output stage including a high voltage field effect transistor (FET) having source, drain and gate electrodes and characterized in having a relatively high threshold voltage; means connecting the source of said high voltage FET to the second power terminal;
    means connecting the drain of said high voltage FET to an output load terminal;
    means connecting an output load between said output load terminal and a power terminal adapted to receive a relatively high operating voltage; and
    means connecting the gate of said high voltage FET to said second node for providing high voltage, high current, amplification with relatively low noise and low offset to the signal at said second node.

2. The combination as claimed in claim 1, wherein said means connecting the emitter of said first and second bipolar transistors to said second power terminal includes third and fourth bipolar transistors and includes:
    a) means connecting the collector-to-emitter path of said third bipolar transistor between the emitter of the first bipolar transistor and the second power terminal;
    b) means connecting the collector-to-emitter path of the fourth bipolar transistor between the emitter of the second bipolar transistor and the second power terminal; and
    c) means connecting the bases of the third and fourth transistors' to the collector of the fourth bipolar transistor at the emitter of the second bipolar transistor.

3. The combination as claimed in claim 2, wherein said first, second, third and fourth bipolar transistors are of the same conductivity type.

4. The combination as claimed in claim 3, wherein said first and second IGFETs are of the same one conductivity type and wherein said bipolar transistors and said high voltage FET are of the same or similar conductivity type.

5. The combination as claimed in claim 1, wherein the means connecting the bases of said first and second bipolar transistors and the collector of said first bipolar transistor to the drain of said first IGFET includes an additional bipolar transistor connected at its base to the collector of the first bipolar transistor and to the drain of said first IGFET, and at its emitter to the bases of said first and second bipolar transistors.

6. The combination as claimed in claim 1, wherein the means connecting the bases of said first and second bipolar transistors and the collector of said first bipolar transistor to the drain of said first IGFET includes an additional IGFET connected at its gate to the collector of the first bipolar transistor and to the drain of said first IGFET, and at its source to the bases of said first and second bipolar transistors.

7. The combination as claimed in claim 1, wherein said high voltage FET is an N-channel, double diffused metal oxide semiconductor transistor.

8. The combination as claimed in claim 1, wherein said means connecting the drain of said first IGFET to said first node includes a third IGFET having its conduction path connected between the drain of said first IGFET and said first node; and wherein said means connecting the drain of said second IGFET to said second node includes a fourth IGFET having its conduction path connected between the drain of said second IGFET and said second node.

9. The combination as claimed in claim 1 wherein said relatively high threshold voltage of said high voltage FET has a value ranging between two and four volts.

10. The combination as claimed in claim 1 wherein said relatively high operating voltage exceeds 100 volts.

11. The combination as claimed in claim 1 wherein said output load is a relatively constant current source; and wherein the current in said output load has an amplitude equal to at least twice the amplitude of the current in said relatively constant current source connected between the first power terminal and the source electrodes of the first and second IGFETs.

12. The combination as claimed in claim 1 wherein said input stage and said output stage are comprised solely of IGFETs.

13. The combination comprising:
first and second power terminals for the application therebetween of an operating potential;
first and second signal input terminals;
an input stage comprising first and second transistors; each transistor having first and second electrodes defining the ends of a main conduction path and a control electrode whose applied potential determines the conductivity of the conduction path;
a relatively constant current source;
means connecting said relatively constant current source between said first power terminal and the first electrodes of said first and second transistors;
means connecting the control electrode of said first transistor to said first signal input terminal and the control electrode of said second transistor to said second signal input terminal;
first and second nodes;
means connecting the second electrode of said first transistor to said first node and the second electrode of said second transistor to said second node;
a current mirror amplifier (CMA), comprised solely of bipolar transistors, having a current input terminal for the application thereto of an input current and having a current output terminal for producing thereat an output current which is proportional to the input current; said CMA including means for rendering the output current equal to K1, where K is a constant and I is the input current, and for causing the output current to be relatively independent of base currents and of the voltage variations at the current output terminal;
means connecting said current input terminal to said first node and said current output terminal to said second node for producing a current signal at said second node having relatively low noise and relatively low voltage offset and being relatively independent of the voltage variations at said second node; and
a high voltage, relatively high power, field effect transistor (FET) characterized in having a relatively large threshold voltage and having source, drain and gate electrodes, with its source being connected to the second power terminal and its drain being coupled to an output load terminal adapted to be coupled to an operating voltage exceeding 100 volts, and means connecting its gate to said second node for providing high voltage, high current, amplification with low noise and low voltage offset.

14. The combination as claimed in claim 13, wherein each one of said first and second transistors is an insulated-gate field transistor (IGFET), the first electrode being the source and the second electrode being the drain of the transistor.

15. The combination as claimed in claim 13 wherein said means connecting the second electrode of said first transistor to said first node and the second electrode of said second transistor to said second node includes a first and second insulated-gate field effect transistors (IGFETs) each IGFET having source and drain electrodes defining the ends of a conduction path and a control electrode; and wherein, the conduction path of said first IGFET is connected between the second electrode of the first transistors and the first node;
wherein the conduction paths of said second IGFET is connected between the second electrode of the second transistors and the second node; and
wherein a relatively fixed bias potential is applied to the control electrodes of said first and second IGFETs.

16. The combination comprising:
first and second power terminals for the application therebetween of an operating potential;
first and second signal input terminals;
first and second insulated-gate field-effect transistors (IGFETs); each IGFET having source and drain electrodes defining the ends of a main conduction path and a control electrode whose applied potential determines the conductivity of the conduction path;
a relatively constant current source;
means connecting said relatively constant current source between said first power terminal and the source electrodes of said first and second IGFETs;
means connecting the control electrode of said first IGFET to said first signal input terminal and the control electrode of said second IGFET to said second signal input terminal;
an output terminal;
means connecting the drain of said second IGFET to said output terminal;
a current mirror, comprised solely of bipolar transistors, comprising first, second, third and fourth bipolar transistors, each bipolar transistor having an emitter and a collector defining the ends of a main conduction path and a base;
means connecting the base of said first and second bipolar transistors and the collector of said first bipolar transistor to the drain of said first IGFET;
means connecting the collector of said second bipolar transistor to said output terminal for producing thereat a low noise, low offset signal corresponding to the differential signal at said first and second input terminals;
means connecting the collector of said third bipolar transistor to the emitter of said first bipolar transistor and its emitter to said second power terminal;
means connecting the base and collector of said fourth bipolar transistor and the base of said third bipolar transistor to the emitter of said second bipolar transistor;
means connecting the emitter of said fourth bipolar transistor to said second power terminal; and
a high voltage double-diffused MOS output transistor having source, drain and gate electrodes and characterized in having a relatively high threshold voltage;
means connecting the source of said output transistor to the second power terminal;
means connecting the drain of said output transistor to a load terminal;
means connecting a load between said load terminal and a power terminal adapted to receive a high operating voltage in excess of 100 volts; and
means connecting the gate of said output transistor to said output terminal for providing at its drain high voltage, high current, signal amplification with relatively low noise and low offset.

* * * * *